United States Patent [19]

Sylvain

[11] Patent Number: 4,972,160

[45] Date of Patent: Nov. 20, 1990

[54] PHASE-LOCK LOOP CIRCUIT WITH IMPROVED OUTPUT SIGNAL JITTER PERFORMANCE

[75] Inventor: Dany Sylvain, Gatineau, Canada

[73] Assignee: Northern Telecom Limited, Montreal, Canada

[21] Appl. No.: 447,313

[22] Filed: Dec. 7, 1989

[51] Int. Cl.⁵ ............................................. H03L 7/085
[52] U.S. Cl. ................................... 331/1 A; 331/17; 331/2 J
[58] Field of Search ........................... 331/1 A, 17, 2 J

[56] References Cited

U.S. PATENT DOCUMENTS

| | | | |
|---|---|---|---|
| 3,931,585 | 1/1976 | Barker et al. | 331/1 A |
| 4,450,518 | 5/1984 | Klee | 331/1 A X |
| 4,503,400 | 3/1985 | Edwards et al. | 331/1 A |
| 4,519,071 | 5/1985 | Miller | 370/84 |
| 4,724,402 | 2/1988 | Ireland | 331/4 |
| 4,748,644 | 5/1988 | Silver et al. | 375/120 |

Primary Examiner—Siegfried H. Grimm
Attorney, Agent, or Firm—F. P. Turpin

[57] ABSTRACT

A phase locked loop has a phase detector which receives an input signal, a divided output signal from a VCO and a local clock signal, and produces a binary number representing the phase relationship between the input and divided signals. The binary number is applied to a microprocessor which compares it to a predetermined number n and controls the VCO through a D/A converter. To reduce output signal jitter, the microprocessor adjusts the VCO frequency so that the binary number alternates between n and n—1 or between n and n+1.

5 Claims, 3 Drawing Sheets

PHASE-LOCK LOOP CIRCUIT WITH IMPROVED OUTPUT SIGNAL JITTER PERFORMANCE

FIELD OF THE INVENTION

This invention relates to phase-lock loop circuits and more specifically to a phase-locked loop circuit having a near jitter-free output characteristic.

BACKGROUND OF THE INVENTION

Phase-locked loop circuits have been used for many years for the purpose of generating a signal in a preferred phase relationship with another signal. Prior art phase-locked loop circuits are exemplified in U.S. Pat. Nos. 4,724,402 in the name of Karl Ireland granted Feb. 9, 1988, 3,931,585 in the name of Barker et al. granted Jan. 6, 1976 and in 4,748,644 in the name of Robert T. Silver et al. granted May 31, 1988. In a telephony system, it is often required to have a local clock synchronized in a preferred phase relationship to a primary master clock provided by a larger, often remote, network. For example, in U.S. Pat. No. 4,519,071 for Phase-Locked Loop and Clock Circuit for a Line Switch, issued May 21, 1985 to Miller, a phase-locked loop circuit permits clock synchronism with any one of a number of PCM lines.

In order for a receiver to receive and capture data referenced to a transmitter's clock signal, it is necessary for the receiver to have a clock signal which is synchronized or phase-aligned to the same clock signal. Therefore, phase-locked loop circuits are often used in the clock circuits of data receivers for the purpose of generating a local clock signal phase-aligned with an incoming reference signal. The phase-locked loop (PLL) circuit within the receiver can adjust its local clock signal frequency to a multiple of the reference signal frequency thereby phase aligning the two signals together. The phase relationship between the reference signal and the local clock signal is then referred to as being locked and the receiver may receive synchronous data.

A digital PLL clock circuit usually comprises a phase detector for measuring the phase relationship between the reference signal and the local signal, a microprocessor, a digital to analog (D/A) converter, and a variable controlled oscillator for responding to the measured phase relationship. Phase detectors are commonly realized in a hardware circuit comprising a counter for counting a number of clock cycles between the reference signal and the feedback local clock signal and a register for storing the counted number of clock cycles representing the measured phase relationship therebetween. The counter is usually incremented with a signal having a frequency many times higher than the frequency of the incoming reference signal and typically the local clock signal or a multiple thereof is used to increment the counter. Due to the asynchronous relationship between the signal used for incrementing the counter and the signal used for sampling the counted value, jitter may appear on the local clock signal with respect to the reference signal. The amount of jitter present on most systems is directly proportional to the period of the signal used for incrementing the counter. In effect, there is a window within which the register is loaded with the counted value, the window being as wide as the period of the signal incrementing the counter. Periodically, the microprocessor updates the counted value with a new counted value. One of the functions of the microprocessor is to provide the D/A converter with a digital value which is a function of the most recently sampled counted value provided by the phase detector. This digital value may be an adjusted value representing the difference between the expected phase offset and the measured phase offset. Typically, when the expected phase offset equals the measured phase offset, the microprocessor does not vary the digital value. In essence, if the D/A converter is providing the oscillator with an analog voltage which is stabilizing the output signal such that the sampled value remains constant, the microprocessor does not vary the digital value. However, the amount of jitter present is proportional to the sampling window size. Thus, it is desirable that the window be as small as possible so as to minimize the amount of jitter that appears on the local clock signal and thus to provide a more stable local clock signal.

One apparently expeditious method to reduce the sampling window size is to increase the frequency with which the counter is incremented, by providing the counter with a stable high frequency signal. However, since PLL circuits typically feed back the output signal to provide local clock signals, the provision of high enough frequencies to obtain a nearly jitterless phase-locked output signal using conventional controllable oscillators is not practicable. For example, a 500 MHz oscillator would be required to achieve a two nanosecond jitter figure.

SUMMARY OF THE INVENTION

It has been found that the effective sampling window size may be reduced greatly by targeting on a transition between two successive counts of the counter instead of targeting on a particular counted value; in effect, by focusing on the transition between counts the jitter is reduced by orders of magnitude.

In accordance with an aspect of the present invention there is provided a method of maintaining a phase relationship between first and second signals that comprises the steps of measuring the phase relationship between the first and second signals, adjusting the phase relationship between the first and second signals until the measured phase relationship corresponds to n time increments, n being a predetermined number. The phase relationship between the first and second signals is then further adjusted until the measured phase relationship differs from n by one time increment in a predetermined direction. The phase relationship between the first and second signals is then repeatedly measured and the frequency of one of the signals adjusted in one and then the other direction to cause the measured phase relationship to alternate between n and n−1 or between n and n+1.

From a different aspect, the invention provides a phase-locked loop circuit for maintaining a phase relationship between first and second signals within narrow limits. A means for controlling the operation of the phase-locked loop circuit includes a microprocessor, a digital-to-analog converter and voltage controlled oscillator. A phase detector circuit is responsive to the first signal, to a divided output signal from the voltage controlled oscillator and to a local clock signal for repetitively generating a binary number n representing a phase relationship between the first and second signals where n corresponds to n time increments where one time increment is equal to a period of the local clock signal. The control means is responsive to the value of the binary number for adjusting the frequency of one of the first and second signals until n is equal to a predetermined number and then for further adjusting the phase relationship between the first and second signals until the binary number corresponds to a phase relationship differing from n by one time increment in a predetermined direction. The control means is responsive to ensuing binary numbers generated by the phase detector circuit for adjusting the frequency of one of the signals in one and then the other direction to cause the binary number to alternate between n and n−1 or between n and n+1.

DESCRIPTION OF THE DRAWINGS

An embodiment of the invention will now be described in conjunction with the drawings in which:

FIG. 1 shows a conventional phase detector 20 responsive to a reference frame pulse (RFP) signal and a local frame pulse (LFP) signal for measuring the phase relationship therebetween. The phase detector 20 is also responsive to a local clock signal provided by a voltage controlled crystal oscillator 26 for measuring the phase relationship between the LFP signal and the RFP signal in time units corresponding to the frequency of the local clock signal. A microprocessor 22 is connected to the phase detector and is responsive to the output signal thereof for controlling the frequency of the local clock signal and thus the phase relationship between the RFP signal and the LFP signals. The microprocessor 22 generates a digital signal corresponding to the measured phase relationship. A digital to analog (D/A) converter 24 is responsive to the digital signal to provide the voltage controlled crystal oscillator (VCXO) 26 with an analog voltage signal which is a function of the measured phase relationship. The oscillator 26 generates a local clock signal having a frequency which varies according to the voltage level of the analog voltage signal. The local clock signal is scaled using a divide-by-N circuit 28 to provide the phase detector 20 with the LFP signal.

Referring now to FIG. 2A, a counter 11 is incremented periodically by the local clock signal for providing a counted value representative of the phase relationship between the LFP and the RFP signals. The counter 11 is cleared by the LFP signal thus providing a seed value of zero from which to start counting. A register 12 connected to the counter and responsive to a sampling clock (LD) signal is periodically loaded with the counted value. Thus, the register 12 takes a snapshot of a count representing the phase offset between the RFP and LFP signals. A timing circuit 10 provides a delay to the RFP signal, synchronizes it to the LFP signal and generates the LD signal. The F-F 14 responds to a rising edge of the LFP signal and a stored RFP signal in F-F 13 to load F-F 15 and hence to generate the LD signal. F-F 15 removes any metastable conditions generated by the circuit. To ensure that the register 12 will be loaded with a valid counted value from the counter 11 it is essential to align the LD signal with the presence of a valid count such that the register 12 is not loaded during the transition of a count from the counter 11. For example, if the counter was counting from 7 (0111) to 8 (1000) internal registers within the counter would have to change state from 0111 to 1000. If the stages in the registers had not all made the transition from 0111 to 1000 there would be a danger of loading the register 12 with any one of 1000, 0111, 1111, 0110, 0101, 0100, 0010, 0001. Thus, the LD signal is a delayed version of the RFP signal that is synchronized to the local clock signal and is used for loading the counted value from counter 11 into the register 12.

Figure 1:
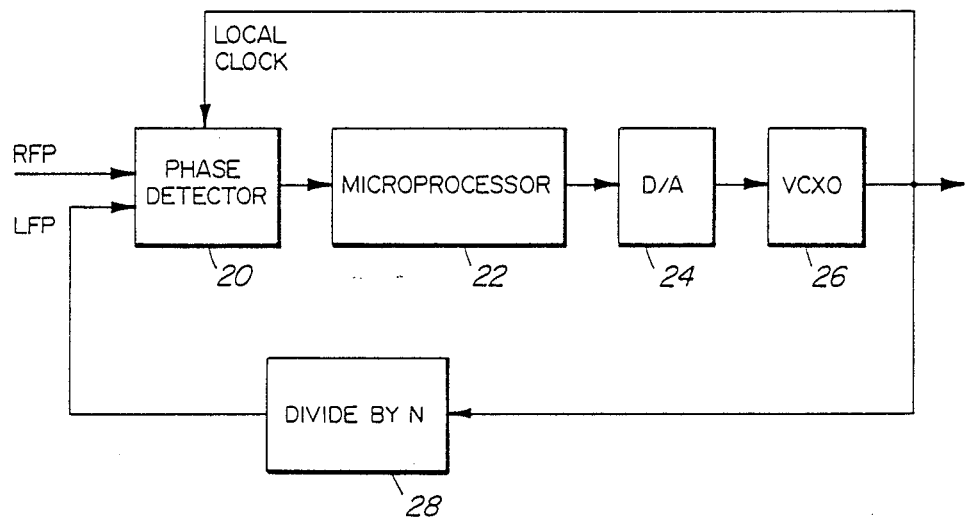
FIG. 1 is a block diagram of a phase-locked loop circuit which may be controlled in accordance with the method of the invention.
Figure 2A:
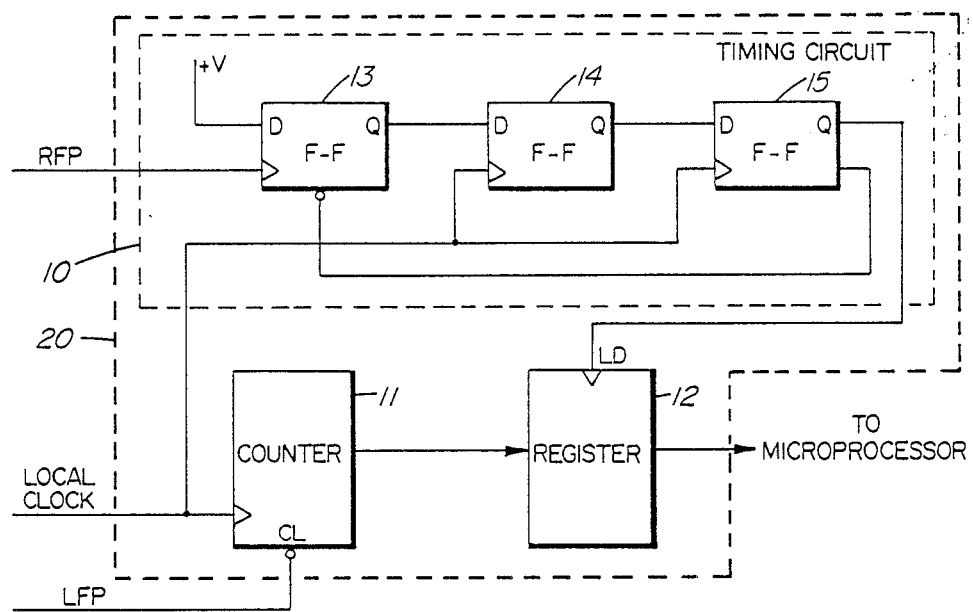
FIG. 2A is a logic block diagram of the phase detector shown in FIG. 1.

The conventional operation of the phase-locked loop circuit shown in FIGS. 1 and 2A may be explained as follows. The counter 11 of the phase detector 20 counts the number of local clock cycles that occurs between an edge of the RFP signal and the corresponding edge of the LFP signal. The unit of time t between two counts of the counter is directly dependent upon the frequency of the local clock signal and corresponds to the number of periods thereof that occur during the phase offset. This unit of time or window which occurs between successive counts is a limiting factor in obtaining a nearly jitterless phase relationship between the RFP signal and the LFP signal. The counter 11 incrementally counts with a periodicity equal to that of the local clock signal and thus the smallest window within which the counted value may be sampled corresponds to one period of the local clock signal. With the presence of an edge of the LD signal, the register 12 is loaded with a counted value corresponding to n time increments where one time increment is equal to a local clock period. From time to time, the microprocessor 22 receives the stored value from the register 12 and if the stored value is not equal to a predetermined number n, the microprocessor provides the D/A converter 24 with a digital value which is a function of the phase difference between the RFP and LFP signals. If the stored value is equal to a predetermined number n representative of a desired phase offset between the RFP signal and the LFP signal, the microprocessor will send to the D/A converter 24 the same value it last sent. Thus, the phase-locked loop is locked and the microprocessor 22 makes no adjustment to the D/A converter 24 which in turn provides the VCXO with the same voltage level it previously provided.

Figure 2B:
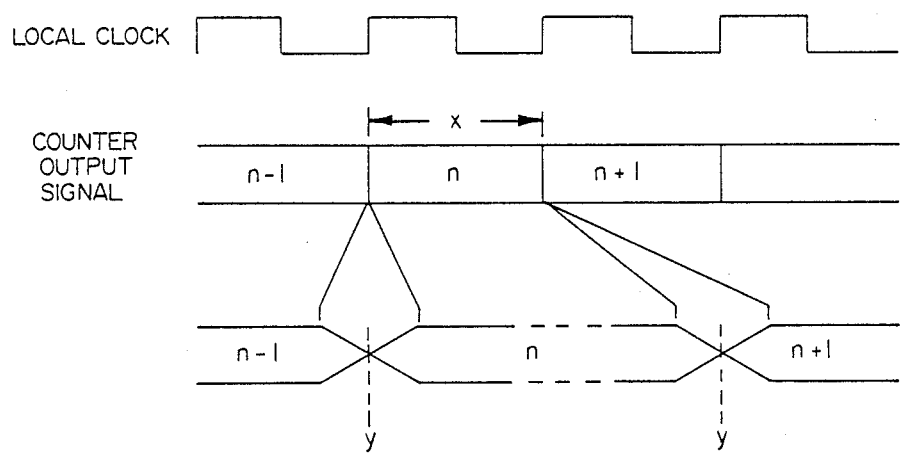
FIG. 2B is a timing diagram depicting the operation of the circuit shown in FIG. 1.
Figure 3:
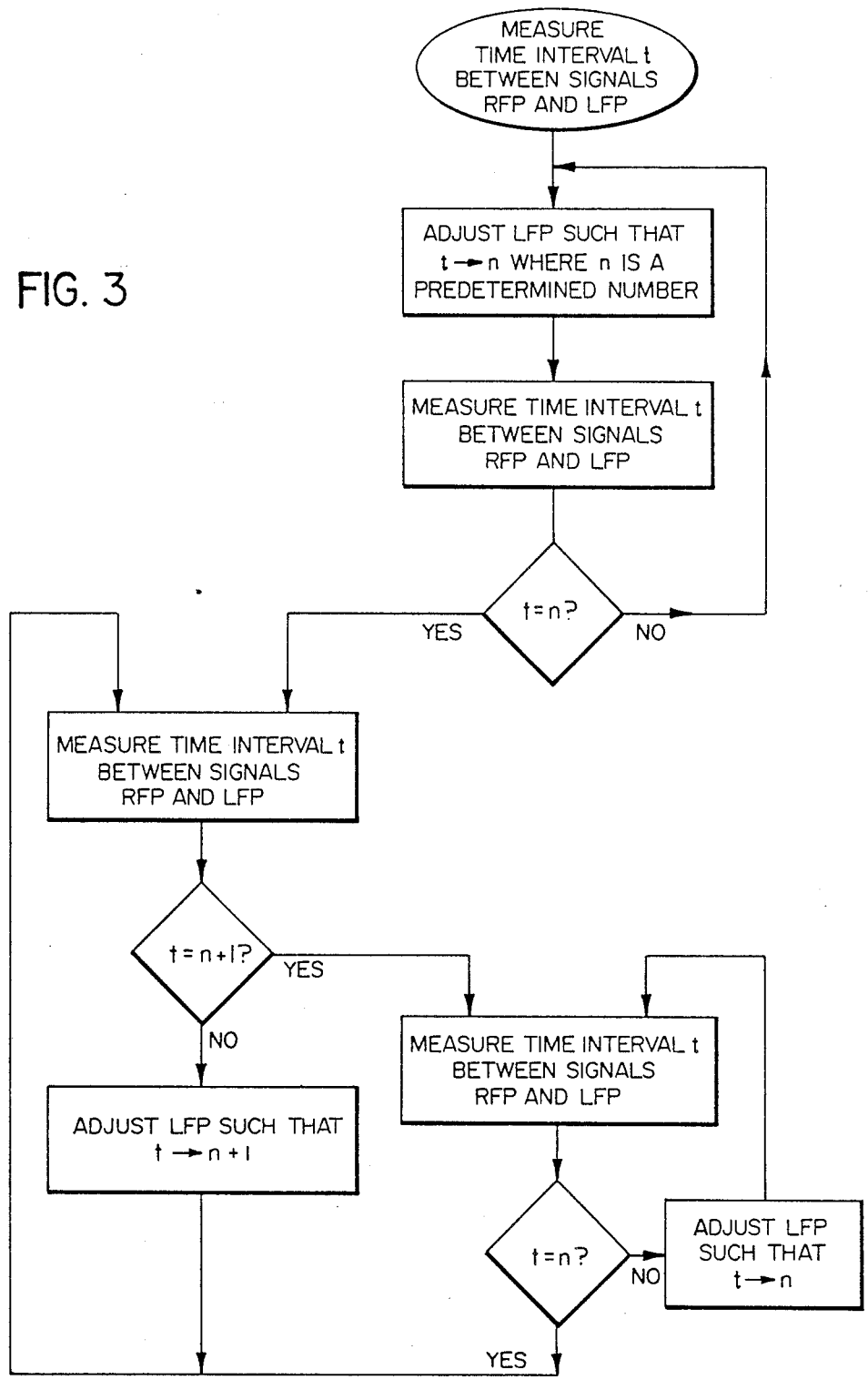
FIG. 3 is a flowchart depicting the method of the invention.

In contrast to the conventional operation described above, the method of the invention results in the elimination of most of the jitter usually associated with the conventional microprocessor controlling operation by narrowing the sampling window to a very small size. The method of the invention is depicted in FIG. 3 and it provides for targeting on the transitional zone that exists between two successive counts of the counter 11 as illustrated in FIG. 2B. As described above, the counter 11 is incremented periodically with the local clock signal and register 12 periodically captures a counted value with the presence of an edge of the LD signal. The microprocessor 22 receives the value stored in the register 12 and compares it to a predetermined number n. If the value is equal to n, the microprocessor provides the D/A converter 24 with the same value it last provided it with. The microprocessor 22 next captures another value and compares it with a predetermined number n+1. If the captured value equals n+1, the microprocessor provides the D/A converter with the same value it provided it with last. This cyclic sequence of steps continues wherein the microprocessor alternatively compares a new captured value with n and then the next captured value with n+1, not altering the digital value that is provided to the D/A converter 24 if the successive captured values alternate between n and n+1. Of course if a captured value is not equal to the expected value the microprocessor provides the D/A converter with a value which will make the next captured value tend toward that expected value. The values n+1 and n can exist without being forced by the microprocessor if the RFP and LFP signals have drifted apart enough to cause the change in measured value since the last capture by the microprocessor. By targeting on n followed by n+1, followed by n, the sampling window becomes orders of magnitude smaller since the target becomes the transition time of a sampling clock signal. Of course, it should be understood that the same result is achieved if the notation n−1 is substituted for the notation n+1 in the above description; however whichever of n+1 or n−1 is selected on a first pass through a control sequence should be maintained on subsequent passes.

As shown in FIG. 2B, the conventional control zone or sampling window for a phase-locked loop circuit corresponds to a time interval x corresponding to a period of the local clock signal whereas the invention provides a control zone that corresponds approximately to the transition zone between two sampling windows. Ideally, the control zone corresponds to a pair of small increments, one on each side of a point indicated at y.

The method and circuit of the invention thus provide an improved phase-lock loop circuit that exhibits an output signal jitter performance improvement of orders of magnitude.

What is claimed is:

1. A method of maintaining a phase relationship between first and second signals within narrow limits comprising the steps of: measuring the phase relationship between the first and second signals, adjusting the phase relationship between the first and second signals until the measured phase relationship corresponds to n time increments, n being a predetermined number, further adjusting the phase relationship between the first and second signals until the measured phase relationship differs from n by one time increment in a predetermined direction and, repeatedly measuring the phase relationship between the first and second signals and adjusting the frequency of one of the signals in one and then the other direction to cause the measured phase relationship to alternate between n and n−1 or between n and n+1.

2. A method of maintaining a phase relationship between first and second signals within narrow limits comprising the continuous ordered steps of:
    (a) measuring an interval of time representing a phase relationship between the first and second signals;
    (b) adjusting the frequency of the second signal until the phase relationship between the first and second signals is represented by a time interval corresponding to n time increments where n is a predetermined number; and
    (c) repeatedly adjusting the phase relationship in a first direction to yield a sampled value different from n by one time increment, and repeatedly measuring the interval of time representing the phase relationship between the first and second signals and repeating steps (b), (c) if the sampled time interval is not equal to n time increments; the direction of incremental adjustment from n always corresponding to the first direction.

3. A method of maintaining a predetermined phase relationship between first and second signals within narrow limits comprising the continuous ordered steps of:
    (a) measuring an interval of time t representing the phase relationship between the first and second signals;
    (b) adjusting the frequency of the second signal such that the interval t tends towards n time increments where n is a predetermined number;
    (c) measuring the interval of time t representing the phase relationship between the first and second signals, and if the measured time interval t is not equal to n, repeating step (b);
    (d) when t is equal to n, adjusting the phase relationship in a first direction such that the interval t tends towards a sampled value different from n by one increment; and
    (e) measuring the interval of time t representing the phase relationship between the first and second signals and repeating steps (b) and (c) if the measured time interval t is not equal to n time increments and repeating steps (d) and (e) when the measured interval t is equal to n time increments, the direction of adjustment from n always corresponding to the first direction.

4. A method of maintaining a phase relationship between first and second signals within narrow limits comprising the steps of:
    (a) measuring an interval of time t representing a phase relationship between the first and second signals;
    (b) adjusting the frequency of the second signal until t corresponds to n time increments where n is a predetermined number;
    (c) measuring the phase relationship between the first and second signals and if t is not equal to n ± one increment, repeatedly measuring and adjusting the phase relationship in a predetermined direction until t is measured to be equal to n ± one increment; and then
    (d) measuring the phase relationship between the first and second signals and if it is not equal to n, repeatedly measuring and adjusting it in a direction opposite to said predetermined direction until it is measured to be equal to n; and
    (e) repeating step (c).

5. A phase-locked loop circuit for maintaining a phase relationship between first and second signals within narrow limits, comprising: means for controlling the operation of the phase-locked loop circuit, the control means including a microprocessor, a digital to analog converter and a voltage controlled oscillator; a phase detector circuit responsive to the first signal, to a divided output signal from the voltage controlled oscillator and to a local clock signal for repetitively generating a binary number n representing a phase relationship between the first and second signals where n corresponds to n time increments where one time increment is equal to a period of the local clock signal, the control means being responsive to the value of the binary number for adjusting the frequency of one of the first and second signals until n is equal to a predetermined number and then for further adjusting the phase relationship between the first and second signals until the binary number corresponds to a phase relationship differing from n by one time increment in a predetermined direction, the control means being responsive to ensuing binary numbers generated by the phase detector circuit for adjusting the frequency of one of the signals in one and then the other direction to cause the binary number to alternate between n and n−1 or between n and n+1.

* * * * *